United States Patent [19]

Nakamura

[11] Patent Number: 5,111,083
[45] Date of Patent: May 5, 1992

[54] DETECTION CIRCUIT FOR DETECTING A PREDETERMINED SIGNAL FROM A COMPOSITE SIGNAL

[75] Inventor: Takeshi Nakamura, Uji, Japan

[73] Assignee: Murata Manufacturing Co., Ltd., Japan

[21] Appl. No.: 620,185

[22] Filed: Nov. 29, 1990

[30] Foreign Application Priority Data

Nov. 30, 1989 [JP] Japan .................................. 1-312662

[51] Int. Cl.$^5$ .......................... H03K 9/06; H03D 13/00
[52] U.S. Cl. ..................................... 307/527; 307/518; 328/133; 328/139
[58] Field of Search ....................... 307/527, 516, 518; 328/55, 133, 134, 155, 139

[56] References Cited

U.S. PATENT DOCUMENTS

| 4,675,613 | 6/1987 | Naegeli et al. | 307/527 |
| 4,675,614 | 6/1987 | Gehrke | 328/133 |
| 4,942,365 | 7/1990 | Satterwhite | 307/527 |

Primary Examiner—Timothy P. Callahan
Attorney, Agent, or Firm—Armstrong, Nikaido, Marmelstein, Kubovcik & Murray

[57] ABSTRACT

The detection circuit includes a first synchronism detection circuit for synchronous detection of an input signal. A second synchronism detection circuit synchronously detects the input signal separately from the first synchronism detection circuit. A phase-shifting circuit outputs differently phased signals to the first synchronism detection circuit and the second synchronism detection circuit. A first smoothing circuit smooths the output of the first synchronism detection circuit. A second smoothing circuit smooths the output of the second synchronism detection circuit. A composite circuit adds the outputs of the first smoothing circuit and the second smoothing circuit. Even when a drift component is contained in the input signal, the detection circuit will output a predetermined output signal in which the drift component is suppressed.

5 Claims, 5 Drawing Sheets

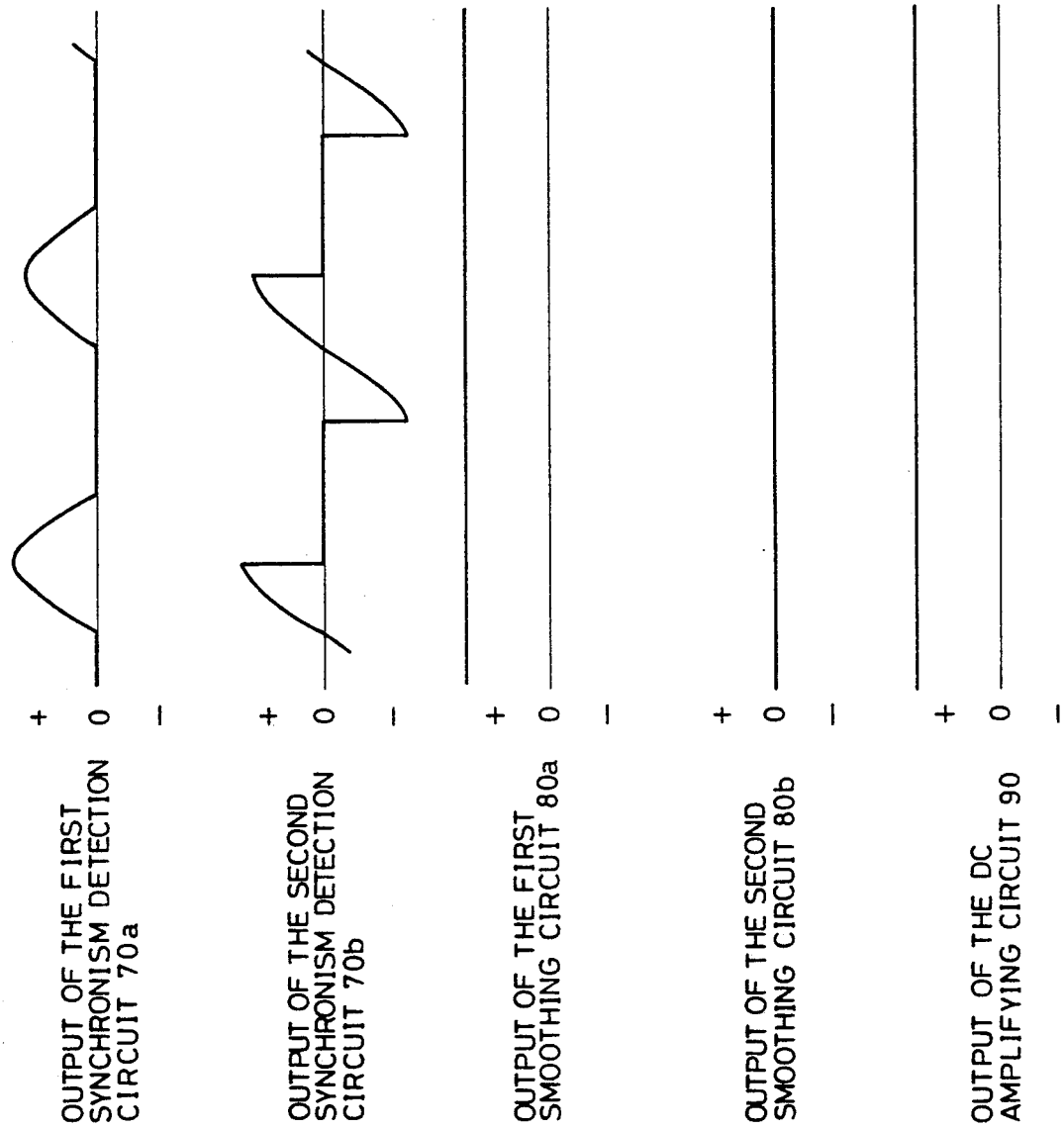

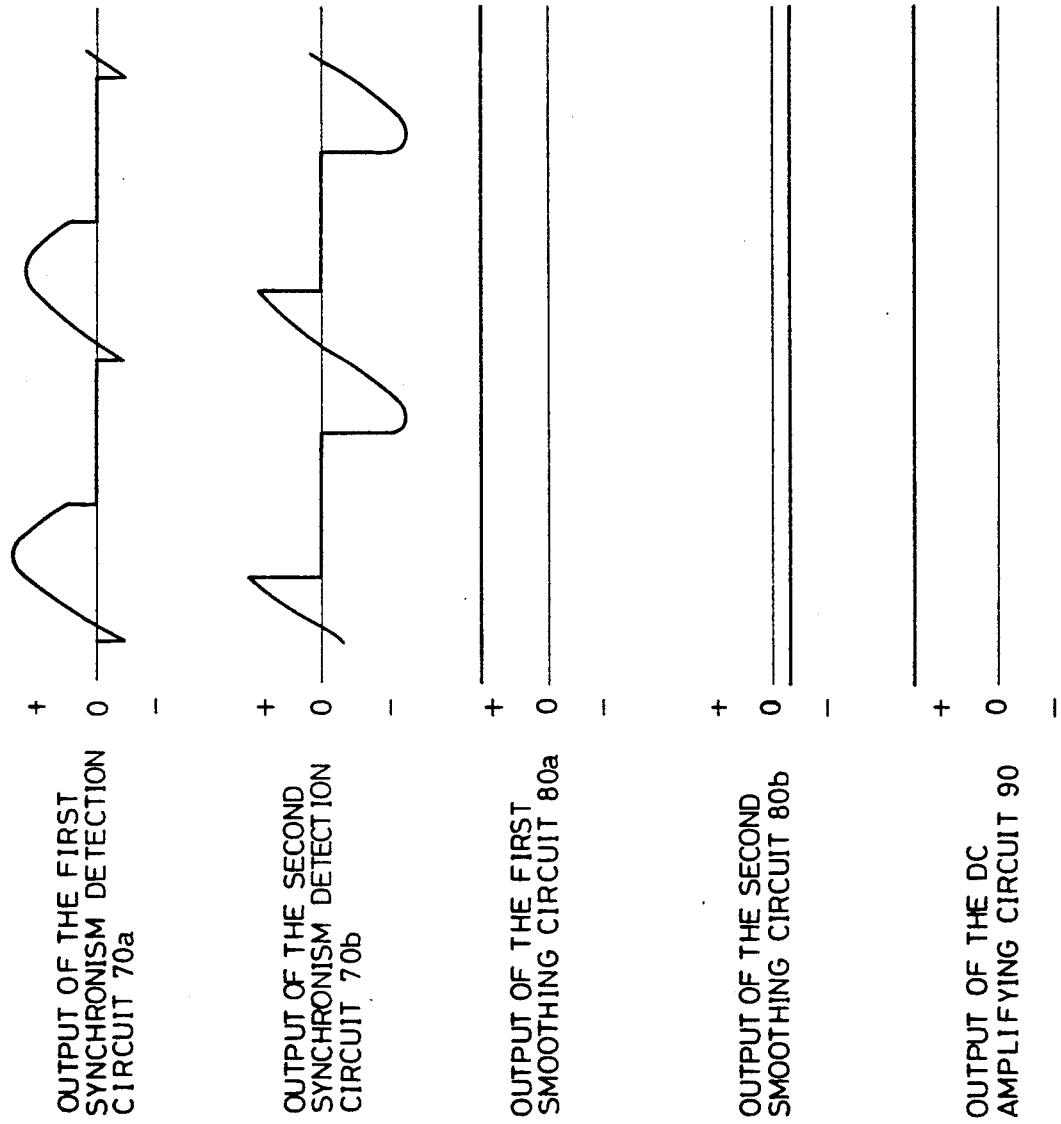

DETECTION CIRCUIT FOR DETECTING A PREDETERMINED SIGNAL FROM A COMPOSITE SIGNAL

BACKGROUND OF THE INVENTION

1. Field of the Invention

The present invention relates to a detection circuit, and particularly, it relates to a detection circuit for detecting a predetermined signal from a composite signal of two signals such as an oscillation gyroscope.

2. Description of the Prior Art

In a conventional gyroscope as the background of the present invention, for example, an oscillator in which a piezoelectric element is formed respectively on three side faces of a triangular prism-shaped oscillating body is used.

In the oscillation gyroscope, two out of these piezoelectric elements are used for detection, and these two piezoelectric elements or the other one piezoelectric element are used for driving.

In this oscillation gyroscope, when the driving signal is applied to the driving piezoelectric element, the oscillating body starts to oscillate. When the oscillator is rotated in this state, an output difference is produced between the two piezoelectric elements for detection, thereby the rotational anglar velocity can be known.

In this oscillation gyroscope, however, due to the processing distortion and stress of the oscillator, variations and accuracy of processing and assembling of the piezoelectric elements and the difference in their thermal expansion coefficients, temperature change and aging occur, thereby an drift component is contained in the output difference between the two piezoelectric elements for detection.

In order to prevent malfunction by the drift component, though a threshold level of an amplifier is set suitably so as not to output the input signal of the drift component level, or a DC surbo circuit is provided, or a high pass filter is disposed to change the circuit time constant, by these means, the change of output difference by the drift component and the change of output difference due to the fine rotational angular velocity can not be distinguished, and their minimum resolving power is poor and the time constant remains, thus the problem occurs in the linearity of output difference against the response speed and the rotational angular velocity.

SUMMARY OF THE INVENTION

Therefore, it is a primary object of the present invention to provide a detection circuit capable of suppressing a drift component.

The present invention is directed to the detection circuit which includes a first synchronism detection circuit for synchronous detection of an input signal, a second synchronism detection circuit for synchronous detection of the input signal separately from the first synchronism detection circuit, a phase-shifting circuit for bringing a phase difference between the first synchronism detection circuit and the second synchronism detection circuit, a first smoothing circuit for smoothing the output of the first synchronism detection circuit, a second smoothing circuit for smoothing the output of the second synchronism detection circuit and a composite circuit for composing the outputs of the first smoothing circuit and the second smoothing circuit.

The input signal is subjected to the synchronous detection in the first synchronism detection circuit. This input signal is also subjected to the synchronous detection in the second synchronism detection circuit. In this case, since the phase difference is caused between the first synchronism detection circuit and the second synchronism detection circuit by the phase-shifting circuit, there is the phase difference between the outputs of the first synchronism detection circuit and the second synchronism detection circuit.

The outputs of the first synchronism detection circuit and the second synchronism detection circuit are smoothed respectively in the first smoothing circuit and the second smoothing circuit.

In the composite circuit, the outputs of the first smoothing circuit and the second smoothing circuit are composed.

A description of using an input signal which includes a drift component will be described.

The drift component appears in the input signal as a phase shift. Therefore, due to the drift component, the output from the first synchronism detection circuit is distorted and the output of the first smoothing circuit is reduced.

Meanwhile, from the second synchronism detection circuit, an output which compensates the output distortion of the first synchronism detection circuit is obtained, and from the second smoothing circuit, an output which compensates the output reduction of the first smoothing circuit is obtained.

The outputs of the firs smoothing circuit and the second smoothing circuit are composed by the composite circuit, so that the output of the composite circuit is obtained as the output in which the drift component is suppressed.

According to the present invention, the detection circuit capable of suppressing the drift component is obtained.

Accordingly, when this detection circuit is used, for example, in an oscillation gyroscope, the output linearity against the rotational angular velocity can be improved irrespective of the presence of the drift component.

The above and other objects, features and aspects of the present invention will become more apparent from the following detailed description of embodiments with reference to the accompanying drawings.

BRIEF DESCRIPTION OF THE DRAWINGS

FIG. 4A and FIG. 4B are graphs respectively showing output waveforms of respective portions of the oscillation gyroscope of FIG. 1, FIG. 4A shows when the drift comonent is not contained in the output of the differential amplifying circuit, and FIG. 4B shows when the drift component is contained.

DESCRIPTION OF THE PREFERRED EMBODIMENTS

Figure 1:
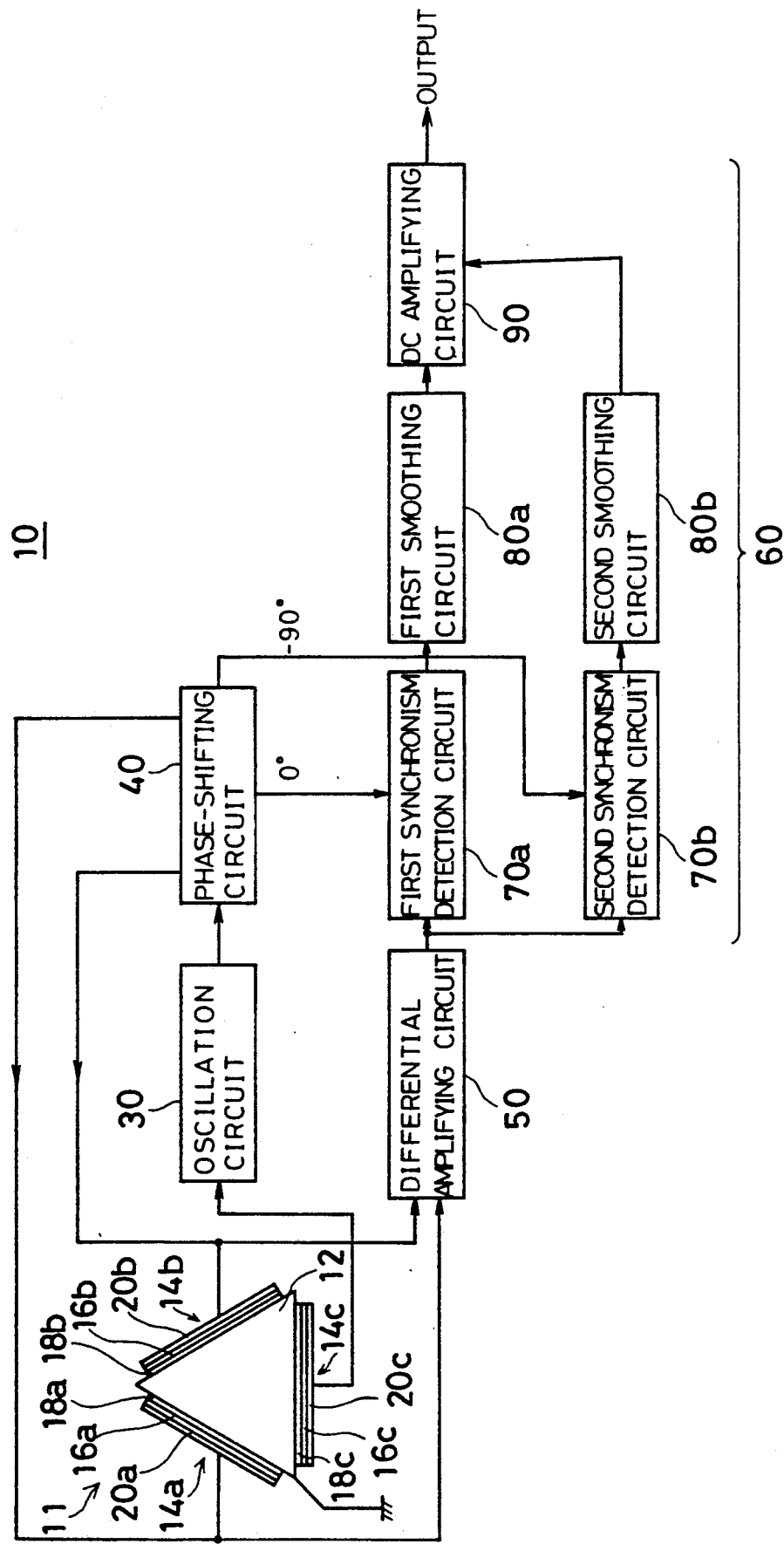
FIG. 1 a block diagram showing an example of an oscillation gyroscope as one embodiment of the present invention.

FIG. 1 is a block diagram showing an example of an oscillation gyroscope as one embodiment of the present invention. Though the oscillation gyroscope is described in the embodiment, it will be indicated in advance that the present invention can be applied in any apparatus obtaining a predetermined signal from the composite signal of two signals, such as a speed sensor or an acceleration sensor besides the oscillation gyroscope.

The oscillation gyroscope 10 includes an oscillator 11 which includes, for example, a regular triangular body 12 is constituted by a material which produces, generally, a mechanical oscillation such as elinvar, iron-nickel alloy, quartz, glass, crystal, ceramic.

On the oscillation body 12, piezoelectric elements 14a, 14b and 14c are formed respectively at the center of three side faces thereof. The piezoelectric element 14a includes a piezoelectric layer 16a consisting of, for example, ceramic, and electrodes 18a and 20a are formed respectively on the surfaces of the piezoelectric layer 16a. The electrodes 18a and 20a are formed with an electrode material such as gold, silver, aluminum, nickel, copper-nickel alloy (Monel metal), by means of a thin-film technique such as sputtering and vacuum evaporation, or depending upon the material, by a printing technique. Similarly, the other piezoelectric elements 14b and 14c respectively include piezoelectric layers 16b and 16c consisting of, for example, ceramic, and electrodes 18b, 20b and 18c, 20c are formed respectively on the surfaces of the piezoelectric layers 16b and 16c. The electrodes 18a to 18c on one side of the piezoelectric elements 14a to 14c are bonded to the oscillating body 12 by means of a conductive adhesive.

The oscillating body 12 is supported by a supporting member (not shown) consisting of, for example, a metal wire in the vicinity of its node point. The supporting member is secured to the oscillating body 12 in the vicinity of the node point by, for example, wedding. The supporting member may be secured by a conductive paste. The supporting member is used as a ground terminal of the oscillation gyroscope 10.

In the oscillator 11, any two piezoelectric elements of the piezoelectric elements 14a to 14c are used for detection, and this two or other one piezoelectric element are used for driving. In this embodiment, for example, two piezoelectric elements 14a and 14b are used for driving and detection. Also, the other piezoelectric element 14c is used for feedback. When the driving signal is applied to the driving and detecting piezoelectric elements 14a and 14b, the oscillating body 12 starts to oscillate, and similar sine waves are output from the piezoelectric elements 14a and 14b. When the oscillator 11 is rotated about its axis in that state, the output of one detecting piezoelectric element increases according to the rotational angular velocity, and conversely, the output of the other detecting piezoelectric element will decrease.

Between the feedback piezoelectric element 14c and the driving piezoelectric elements 14a, 14b of the osillation gyroscope 10, an oscillation circuit 30 is connected as a feedback loop for self-oscillation driving of the oscillation gyroscope 10.

Figure 2:
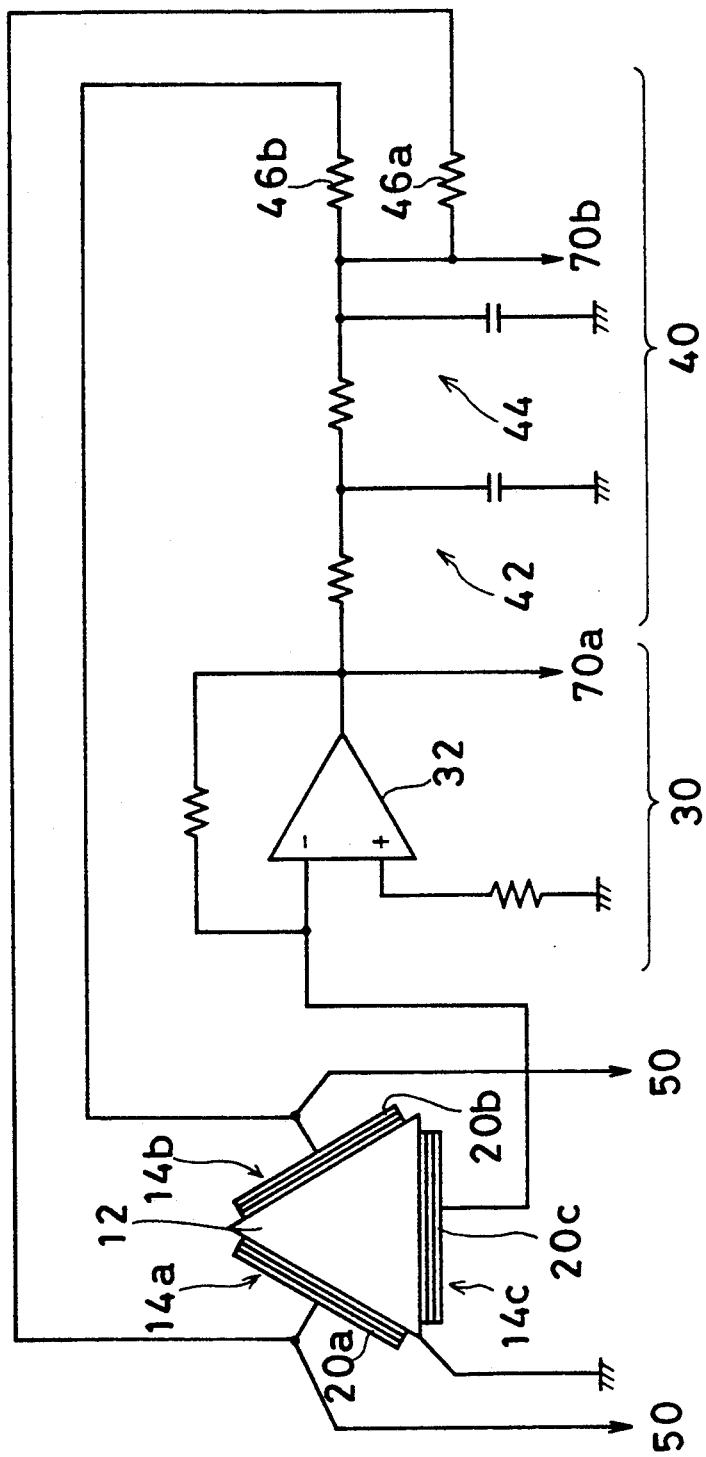
FIG. 2 is a circuit diagram showing a feedback loop of the oscillation gyroscope of FIG. 1.

As shown in FIG. 2, the oscillation circuit 30 is constituted by, for example, an inversion amplifying circuit including an operational amplifier 32. The inversion amplifying circuit is designed to inverse the output phase from the feedback piezoelectric element 14c and to amplify its signal.

Furthermore, an output terminal of the oscillation circuit 30 is, as shown in FIG. 1, connected to an input terminal of a phase-shifting circuit 40.

As shown in FIG. 2, the phase-shifting circuit 40 includes, for example, two-stage RC filters 42 and 44, each having a lagging power-factor of, for example, 45 degree. The phase-shifting circuit 40 is designed to delay the output phase from the oscillation circuit 30 by 90 degree, and to suppress the high-frequency component included in the output. The output side of the rear-stage RC filter 44 is connected to the electrode 20a of the piezoelectric element 14a via a resistance 46a, and to the electrode 20b of the piezoelectric element 14b via a separate resistance 46b.

Meanwhile, as shown in FIG. 1, the piezoelectric elements 14a and 14b of the oscillation gyroscope 10 are connected respectively to two input terminals of a differential amplifying circuit 50 for detecting their output difference.

Figure 3:
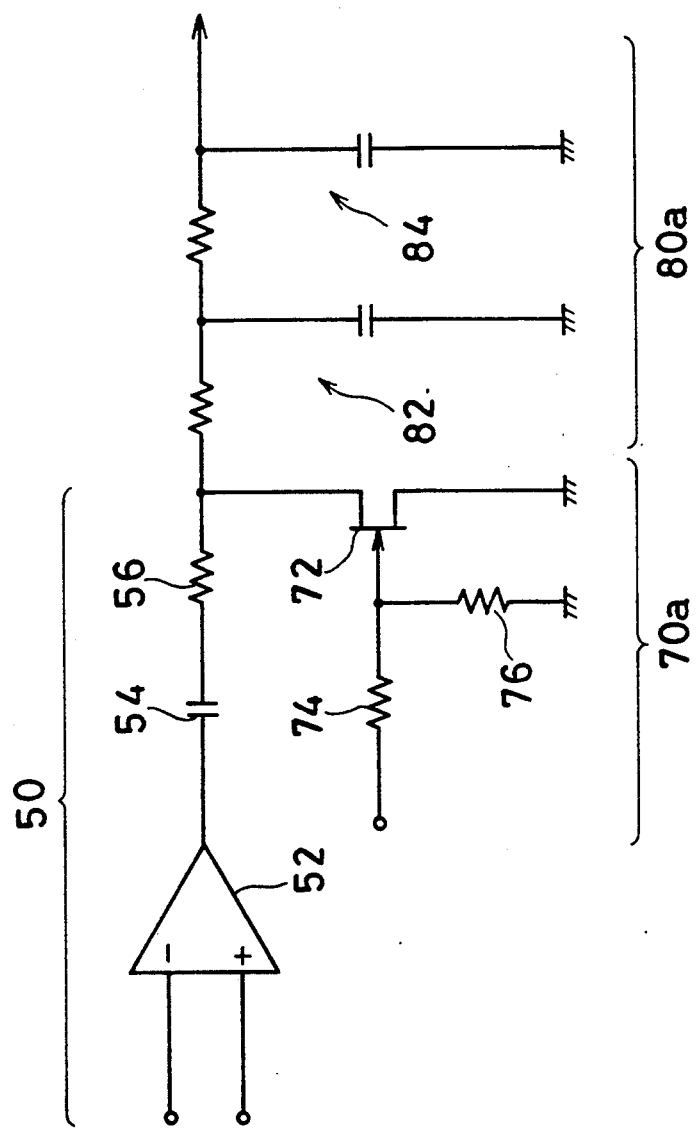
FIG. 3 is a circuit diagram showing a differential amplifying circuit, a first synchronism detection circuit and a first smoothing circuit of the oscillation gyroscope of FIG. 1.

That is, as shown in FIG. 3, the differential amplifying circuit 50 includes, for example, an operational amplifier 52, to the non-inversion input terminal and inversion input terminal of which, the electrodes 20a and 20b of the piezoelectric elements 14a and 14b are connected respectively. Moreover, to the output side of the operational amplifier 52, a capacitor 54 and a resistance 56 for coupling are connected in series.

As shown in FIG. 1, the output terminal of the differential amplifying circuit 50 is connected to a first synchronism detection circuit 70a and a second synchronism detection circuit 70b constituting a portion of a detection circuit 60.

Since the first synchronism detection circuit 70a and the second synchronism detection circuit 70b have the same circuit configuration, particularly, the first synchronism detection circuit 70a is described in detail with reference to FIG. 3.

That is, an shown in FIG. 3, the first synchronism detection circuit 70a includes, for example, an FET 72 whose source is connected to the resistance 56 of the differential amplifying circuit 50. A drain of the FET 72 is grounded. Moreover, a gate of the FET 72 is connected to the input side of the RC filter 42 (refer to FIG. 2) of the phase-shifting circuit 40 via a resistance 74. The gate of the FET 72 is also grounded via a separate resistance 76. Accordingly, to the gate of the FET 72, the input side signal of the RC filter 42 of the phase-shifting circuit 40 is applied in the form of partial pressure through the resistances 74 and 76.

Though the circuit configuration of the second synchronism detection circuit 70b is similar to that of the first synchronism detection circuit 70a, to the gate of the FET, the output side signal of the RC filter 44 (refer to FIG. 2) of the phase-shifting circuit 40 is applied in the form of partial pressure through two separate resistances.

Accordingly, by the phase-shifting circuit 40, there is a phase difference of 90 degree between the first synchronism detection circuit 70a and the synchronism detection circuit 70b.

Also, as shown in FIG. 1, the first synchronism detection circuit 70a and the second synchronism detection circuit 70b are connected respectively to input terminals of a first smoothing circuit 80a and a second smoothing circuit 80b.

As shown in FIG. 3, the first smoothing circuit 80a includes two-stage RC filters 82 and 84, the front-stage RC filter 82 being connected to the source of the FET 72 of the first synchronism detection circuit 70a.

The second smoothing circuit 80b has the same circuit configuration as the first smoothing circuit 80a, and its front-stage RC filter is connected to a source of the FET of the second synchronism detection circuit 70b.

Furthermore, as shown in FIG. 1, output terminals of the first smoothing circuit 80a and the second smoothing circuit 80b are connected to two input terminals of a DC amplifying circuit 90 as a composite circuit. As the DC amplifying circuit 90, an amplifying circuit such as a differential amplifying circuit is used.

Next, the operation of the respective circuits of the osillation gyroscope 10 will be explained with reference to FIG. 1 through FIG. 3 and FIGS. 4A, 4B. In FIG. 4A, the output of the first synchronism detection circuit 70a, the output of the second synchronism detection circuit 70b, the output of the first smoothing circuit 80a, the output of the second smoothing circuit 80b and the output of the DC amplifying circuit 90 in case the drift component is not contained in the output of the oscillator 11 or in the outputs of the piezoelectric elements 14a and 14b for detection, are shown, and in FIG. 4B, those outputs in case the drift component is contained in the outputs of the piezoelectric elements 14a and 14b are shown.

Since the output of the feedback piezoelectric element 14c of the oscillator 11 is fed back to the driving piezoelectric elements 14a and 14b by the oscillation circuit 30 and the phase-shifting circuit 40 as the feedback loop, the oscillation gyroscope 10 is self-oscillated. In this case, the output of the feedback piezoelectric element 14c is delayed by 180 degree in the oscillation circuit 30, by 90 degree in the two-stage RC filters 42 and 44 of the phase-shifting circuit 40, and further, by 90 degree by the electrostatic capacity of the resistances 46a, 46b and the driving piezoelectric elements 14a, 14b, and fed back to the piezoelectric elements 14a and 14b. Therefore, the output of the feedback piezoelectric element 14c and the input of the driving piezoelectric elements 14a and 14b become in-phase, thereby the oscillator 11 is self-oscillated efficiently.

In the oscillation gyroscope 10, in case the oscillator 11 is rotated in one direction about its axis, for example, the output of one detecting piezoelectric element 14a increases and the output of the other piezoelectric element 14b will decrease. Thus, the output difference therebetween is output as a sine wave from the differential amplifying circuit 50.

The output of the differential amplifying circuit 50 is subjected to synchronous detection in the first synchronism detection circuit 70a. In this embodiment, the output of the differential amplifying circuit 50 is passed only on the positive side in the first synchronism detection circuit 70a. Therefore, as shown in FIG. 4A, the output of the first synchronism detection circuit 70a takes the waveform of half-wave rectification of only the positive side of the sine wave. Moreover, the output of the first synchronism detection circuit 70a is rectified in the first smoothing circuit 80a into the positive direct current.

Also, the output of the differential amplifying circuit 50 is subjected to synchronous detection at the 90 degree phase lag, by the second synchronism detection circuit 70b. Accordingly, the output of the second synchronism detection circuit 70b, as shown in FIG. 4A, takes the heteroformal waveform having a substantially triangular wave of the same size respectively on the positive and negative sides. Furthermore, though the output of the second synchronism detection circuit 70b is rectified in the second smoothing circuit 80b, since the output of the second synchronism detection circuit 80b appears in the same magnitudes on the positive and negative sides, the output of the second smoothing circuit 80 becomes zero.

The outputs of the first smoothing circuit 80a and the second smoothing circuit 80b are composed in the DC amplifying circuit 90.

Accordingly, the output of the detection circuit 60 becomes the direct current, which is obtained by smoothing the half-wave rectified output of the differential amplifying circuit 50.

Meanwhile, the drift component may be contained in the outputs of the detecting piezoelectric elements 14a and 14b by change in temperature and with time. Such a drift component appears as a phase shift in the outputs of the piezoelectric elements 14a and 14b. For example, the output phases of both the piezoelectric elements 14a and 14b are delayed.

In the case of containing such drift component, though the output of the differential amplifying circuit 50 becomes the sine wave of the same size, its phase delays more or less by the drift component, as compared with the case containing no drift component.

In this case, as shown in FIG. 4B, the output of the first synchronism detection circuit 70a is deleted at a portion corresponding to a substantially triangular wave preceding in the waveform obtained by the half-wave rectification of the sine wave, and becomes the heteroformal waveform having a substantially triangular wave of the size corresponding to that portion on the negative side. Therefore, the output of the first smoothing circuit 80a becomes somewhat smaller as compared with the case wherein the drift component is not contained.

As the output of the differential amplifying circuit 50 delays a little, as shown in FIG. 4B, the output of the second synchronism detection circuit 70b becomes smaller on the positive side and larger on the negative side. The output of the second smoothing circuit 80b becomes a negative direct current which is substantially the same magnitude as the decreased output of the first smoothing circuit 80a.

As such, since the output of the second smoothing circuit 80b becomes the negative direct current which is substantially the same magnitude as the decreased output of the first smoothing circuit 80a, the output of the DC amplifying circuit 90 becomes substantially the same magnitude as the case containing no drift component.

Accordingly, in the detection circuit 60, even when the drift component is contained in the input signal, a predetermined output signal in which the drift component is suppressed is obtained.

While, as the rotational angular velocity of the oscillation gyroscope 10 becomes larger, the output difference of the piezoelectric elements 14a and 14b or the output of the differential amplifying circuit 50 becomes larger, so that the output of the detection circuit 60 also becomes larger. Therefore, the rotational angular velocity of the oscillation gyroscope 10 may be known from the magnitude of the output of the detection circuit 60.

Accordingly, in the oscillation gyroscope 10, from the magnitude of the output of the detection circuit 60, the rotational angular velocity can be known also for the case wherein the drift component is contained, as same as the case wherein the drift component is not contained.

When the oscillation gyroscope 10 is rotating in the opposite direction, since the magnitude of the outputs of the piezoelectric elements 14a and 14b are reversed, a negative direct current is output from the detection circuit 60. Accordingly, from the output polarity of the detection circuit 60, a rotating direction of the oscillation gyroscope 10 may be known.

Meanwhile in the oscillation gyroscope 10, in case the oscillator 11 is not rotated, a same sine wave is output from the piezoelectric elements 14a and 14b, and the output of the differential amplifying circuit 50 or the detection circuit 60 becomes zero, it is known that the oscillation gyroscope 10 is not rotating.

In the embodiment aforementioned, though the phase difference between the first synchronism detection circuit 70a and the second synchronism detection circuit 70b is made at 90 degree by the phase-shifting circuit 40, in order to make the phase difference at 90 degree, in place of the phase-shifting circuit 40, a phase-shifting circuit having a phase of 90 degree may be disposed at the front stage of one synchronism detection circuit, or the phase-shifting circuits having each other the phase difference of 90 degree may be disposed respectively at the front stage of the two synchronism detection circuits.

The phase difference between the first synchronism detection circuit 70a and the second synchronism detection circuit 70b may be set at other magnitudes such as 30 degree, 45 degree or 60 degree besides 90 degree, in this case, the drift component can also be suppressed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A detection circuit comprising:
   a first synchronism detection circuit for synchronous detection of an input signal;
   a second synchronism detection circuit for synchronous detection of said input signal separately from said first synchronism detection circuit;
   a phase-shifting circuit, connected to said first and second synchronous detection circuits, for outputting a signal having a first phase to said first synchronism detection circuit and having a second phase to said second synchronism detection circuit;
   a first smoothing circuit, connected to said first synchronous detection circuit, for smoothing an output of said first synchronism detection circuit;
   a second smoothing circuit, connected to said second synchronous detection circuit, for smoothing an output of said second synchronism detection circuit; and
   a composite circuit, connected to said first and second smoothing circuits, for adding outputs of said first smoothing circuit and said second smoothing circuit and for outputting a composed signal.

2. A detection circuit in accordance with claim 1, wherein said first synchronism detection circuit and said second synchronism detection circuit have a phase difference of 90 degree.

3. A detection circuit in accordance with claim 2, wherein said first synchronism detection circuit and said second synchronism detection circuit respectively include an FET having a source connected to said input signal and a gate connected to said phase-shifting circuit.

4. A detection circuit in accordance with claim 3, wherein said first smoothing circuit and said second smoothing circuit respectively include an RC filter.

5. A detection circuit in accordance with claim 4, wherein said composite circuit includes a differential amplifying circuit.

* * * * *